United States Patent
Kim et al.

(10) Patent No.: US 10,222,624 B2
(45) Date of Patent: Mar. 5, 2019

(54) MULTI-CHANNEL OPTICAL MODULE DEVICE

(71) Applicant: ELECTRONICS AND TELECOMMUNICATIONS RESEARCH INSTITUTE, Daejeon (KR)

(72) Inventors: Jeong Eun Kim, Gwangju (KR); Hyun Seo Kang, Gwangju (KR); Keo-Sik Kim, Gwangju (KR); Ji Hyoung Ryu, Jeonju (KR); Hyoungjun Park, Gwangju (KR); Young Soon Heo, Gwangju (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 24 days.

(21) Appl. No.: 15/133,988

(22) Filed: Apr. 20, 2016

(65) Prior Publication Data

US 2017/0131557 A1     May 11, 2017

(30) Foreign Application Priority Data

Nov. 6, 2015    (KR) .................. 10-2015-0156178

(51) Int. Cl.
*G02B 27/10*        (2006.01)
*G02B 27/14*        (2006.01)
(Continued)

(52) U.S. Cl.
CPC ......... *G02B 27/1006* (2013.01); *G02B 27/14* (2013.01); *H01S 5/0071* (2013.01);
(Continued)

(58) Field of Classification Search
CPC . H01L 2924/00014; H01L 2224/05166; H01L 2224/05144; H01L 2224/05169;
(Continued)

(56) References Cited

U.S. PATENT DOCUMENTS 7,012,939 B2    3/2006    Choi et al.
8,641,298 B2    2/2014    Lim et al.
(Continued)

FOREIGN PATENT DOCUMENTS

JP             3997775 B2    8/2007
KR       10-1493257 B1    2/2015
(Continued)

*Primary Examiner* — Brandi Thomas (57) ABSTRACT

Provided is a multi-channel optical module device. The optical module device includes: a light source unit configured to include a plurality of laser diodes that are capable of wavelength modulation according to current; a beam splitter unit configured to include a plurality of beam splitters that have different reflectivity and transmissivity and reflect or transmit light output from each laser diode of the light source unit to output them in a first direction or a second direction; and an optical coupler configured to couple and output the light from the beam splitter unit. Center wavelengths of the laser diodes of the light source unit are different from each other, and the number of output channels varies according to the number of laser diodes.

9 Claims, 6 Drawing Sheets

(51) Int. Cl.
*H01S 5/00* (2006.01)
*H01S 5/062* (2006.01)
*H01S 5/40* (2006.01)

(52) U.S. Cl.
CPC ........ *H01S 5/06206* (2013.01); *H01S 5/4012* (2013.01); *H01S 5/005* (2013.01); *H01S 5/4087* (2013.01)

(58) Field of Classification Search
CPC . H01L 2224/48091; H01L 2924/10253; H01L 2924/00; H01L 2924/01078; H01L 2924/01079; H01L 2224/05573; H01L 2224/14; H01L 2224/05568; G02B 27/1006; G02B 27/145; G02B 27/283; G02B 21/06
USPC .................................................. 359/619–633
See application file for complete search history.

(56) References Cited

U.S. PATENT DOCUMENTS

| | | | |
|---|---|---|---|
| 8,879,601 | B1 | 11/2014 | Lee |
| 9,817,222 | B2* | 11/2017 | Suzuki ................... G02B 21/06 |
| 2006/0088255 | A1 | 4/2006 | Wu et al. |
| 2013/0108262 | A1 | 5/2013 | Lim et al. |
| 2013/0195456 | A1 | 8/2013 | Sorin et al. |
| 2014/0270778 | A1 | 9/2014 | Hui et al. |
| 2015/0131105 | A1 | 5/2015 | Kim et al. |
| 2015/0318951 | A1* | 11/2015 | Zhang ................... G02B 27/28 398/65 |

FOREIGN PATENT DOCUMENTS

| | | |
|---|---|---|
| KR | 10-2015-0026803 A | 3/2015 |
| KR | 10-2015-0054542 A | 5/2015 |

\* cited by examiner

MULTI-CHANNEL OPTICAL MODULE DEVICE

CROSS-REFERENCE TO RELATED APPLICATION

This application claims priority to and the benefit of Korean Patent Application No. 10-2015-0156178 filed in the Korean Intellectual Property Office on Nov. 6, 2015, the entire contents of which are incorporated herein by reference.

BACKGROUND OF THE INVENTION (a) Field of the Invention

The present invention relates to a multi-channel optical module device.

(b) Description of the Related Art

Recently, a physical quantity measurement system such as an FBG (fiber Bragg grating) sensor interrogator that requires a wideband light source has been used. However, the wideband light source is expensive and its size is large, which presents many use limitations.

A light source for solving this problem has been developed. Specifically, light outputted from a plurality of laser diodes that have the same optical power and different center wavelengths is coupled by an optical coupler and then is outputted to an optical fiber. After that, current inputted to each laser diode is sequentially modulated (as a result, the output wavelength of the each laser diode is modulated by many nanometers) so that the wavelength of the light outputted from the final output channel varies by tens of nanometers. The light source of this type has been developed. For instance, if the center wavelengths of the laser diodes are $\lambda_1, \lambda_2, \lambda_3, \ldots, \lambda_N$ (here, the optical intensity of the laser diodes has to be similar), respectively, when the center wavelength of each laser diode varies by a according to the current modulation (here, the a has to be larger than the difference between the center wavelengths of the laser diodes), the wavelength of the final output light obtained by coupling a plurality of laser diodes, that is, N light sources, may vary by $\alpha N$.

However, optical loss in the optical coupler itself is very large, and in order to form an output channel having different tunable wavelength ranges, an optical coupler having the required number of channels has to be used in the beginning of manufacturing an optical module device.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an optical module device having an advantage of low optical loss.

Also, the present invention has been made in an effort to provide an optical module device having an advantage of easily increasing or decreasing channels.

Further, the present invention has been made in an effort to provide an optical module device having an advantage of easily adjusting the tunable wavelength range of the final output light.

An exemplary embodiment of the present invention provides an optical module device. The optical module device includes: a light source unit configured to include a plurality of laser diodes that are capable of wavelength modulation according to current; a beam splitter unit configured to include a plurality of beam splitters that have different reflectivity and transmissivity and reflect or transmit light outputted from each laser diode of the light source unit to output them in a first direction or a second direction; and an optical coupler configured to couple and output the light from the beam splitter unit, wherein center wavelengths of the laser diodes of the light source unit are different from each other.

When the number of laser diodes of the light source unit is N, the number of beam splitters of the beam splitter unit may be N−1.

The light outputted in the first direction from the beam splitter unit may be outputted through a first output channel, and the optical coupler may couple the light outputted in the second direction from the beam splitter unit to output them through a second output channel, wherein the first direction may be perpendicular to the second direction.

A wavelength band of each output channel may be determined by wavelengths of the laser diodes.

Also, optical intensities of the output channels may be equal to each other.

When the plurality of beam splitters of the beam splitter unit are sequentially disposed on the same optical axis and light is inputted in parallel to the optical axis, the farther away from a side to which the light is inputted a position of a beam splitter may be, the lower the reflectivity of the beam splitter may be, and each beam splitter may have reflectivity of $1/(k+1)$, wherein the k may represent an order of a beam splitter.

Another embodiment of the present invention provides an optical module device. The optical module device includes: an optical module unit configured to vary wavelengths of light and to output the light through a plurality of channels; and at least one optical divider configured to divide the light outputted through each channel of the optical module unit and to output them through a plurality of output channels, wherein the optical module unit includes: a light source unit configured to include a plurality of laser diodes that are capable of wavelength modulation according to current; a beam splitter unit configured to include a plurality of beam splitters that have different reflectivity and transmissivity and reflect or transmit light outputted from each laser diode of the light source unit to output them in a first direction or a second direction; and an optical coupler configured to couple and output the light from the beam splitter unit.

Center wavelengths of the laser diodes of the light source unit may be different from each other. Also, when the plurality of beam splitters of the beam splitter unit are sequentially disposed on the same optical axis and light is inputted in parallel to the optical axis, the farther away from a side to which the light is inputted a position of a beam splitter may be, the lower the reflectivity of the beam splitter may be, and each beam splitter may have reflectivity of $1/(k+1)$, wherein the k may represent an order of a beam splitter.

When the number of laser diodes of the light source unit is N, the number of beam splitters of the beam splitter unit may be N−1.

The light outputted in the first direction from the beam splitter unit may be outputted through a first channel, and the optical coupler may couple the light outputted in the second direction from the beam splitter unit to output them through a second channel, wherein the first direction may be perpendicular to the second direction.

The optical divider may include: a first optical splitter configured to divide the light outputted through the first channel to output the light through two channels; and a second optical splitter configured to divide the light outputted through the second channel to output the light through two channels.

Yet another embodiment of the present invention provides an optical module device. The optical module device includes: a plurality of optical module units configured to vary wavelengths of light and to output the light through a plurality of channels; and at least one additional optical coupler configured to couple the light outputted through each channel of the optical module unit and to output them through an output channel, wherein each of the plurality of optical module units includes: a light source unit configured to include a plurality of laser diodes that are capable of wavelength modulation according to current; a beam splitter unit configured to include a plurality of beam splitters that have different reflectivity and transmissivity and reflect or transmit light outputted from each laser diode of the light source unit to output them in a first direction or a second direction; and an optical coupler configured to couple and output the light from the beam splitter unit.

Center wavelengths of the laser diodes of the light source unit may be different from each other. Also, when the plurality of beam splitters of the beam splitter unit are sequentially disposed on the same optical axis and light is inputted in parallel to the optical axis, the farther away from a side to which the light is inputted a position of a beam splitter may be, the lower the reflectivity of the beam splitter may be, and each beam splitter may have reflectivity of $1/(k+1)$, wherein the k may represent an order of a beam splitter.

When the number of laser diodes of the light source unit is N, the number of beam splitters of the beam splitter unit may be N−1.

The optical module device may include a plurality of output channels, and a tunable wavelength range of an output channel may be different from that of another output channel.

Among the plurality of optical module units, an optical module unit may have a first tunable wavelength range, and another optical module unit may have a second tunable wavelength range, wherein the first tunable wavelength range and the second tunable wavelength range may be in series.

The at least one additional optical coupler may include: a first additional optical coupler configured to couple and output the light output through the first channel of the optical module unit; and a second additional optical coupler configured to couple and output the light output through the second channel of the optical module unit.

An output of the first additional optical coupler may function as a first output channel, the second channel of the optical module unit may function as a second output channel, and an output end of the second additional optical coupler may function as a third output channel, wherein tunable wavelength ranges of the first and third output channels may be different from a tunable wavelength range of the second output channel.

The light outputted in the first direction from the beam splitter unit may be outputted through a first channel, and the optical coupler may couple the light outputted in the second direction from the beam splitter unit to output them through a second channel, wherein the first direction may be perpendicular to the second direction.

DETAILED DESCRIPTION OF THE EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout the specification, in addition, unless explicitly described to the contrary, the word "comprise" and variations such as "comprises" or "comprising" will be understood to imply the inclusion of stated elements but not the exclusion of any other elements.

Hereinafter, a multi-channel optical module device according to an exemplary embodiment of the present invention will be described.

Figure 1:
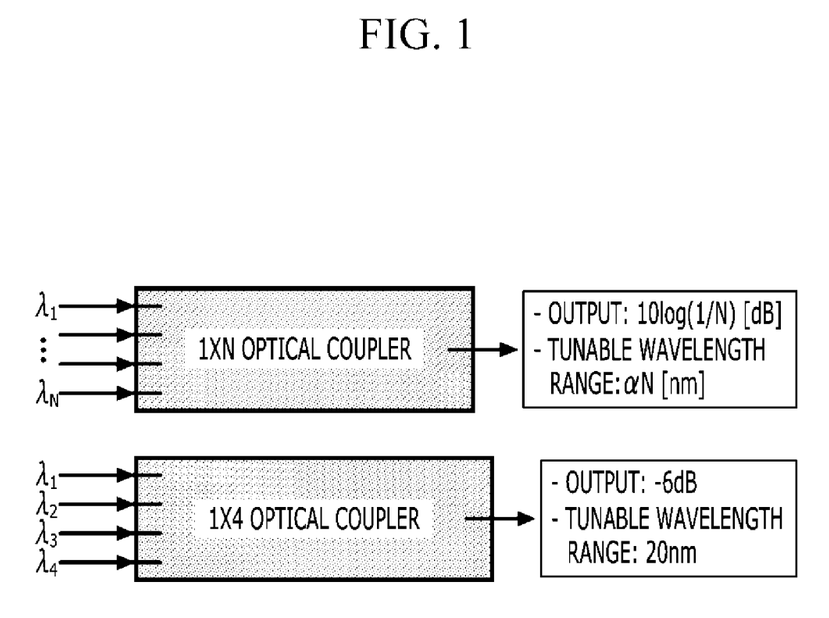
FIG. 1 shows a structure of an optical module device with an optical coupler.

FIG. 1 shows a structure of an optical module device with an optical coupler.

The optical module device couples light outputted from a plurality of light resources, for example, laser diodes, by using a 1×N optical coupler as shown in FIG. 1. At this time, optical loss caused by coupling of the optical coupler occurs. According to the characteristic of the optical coupler, the output enable maximum intensity of light is 10 log (1/N) [dB]. For example, optical power of laser diodes is similar to each other. In a case in which the maximum distance between center wavelengths of the laser diodes is 5 nm and each wavelength modulation range of each of laser diodes is 5 nm, when light outputted from 4 laser diodes is coupled by a 1×4 optical coupler, the maximum optical power is −6 dB (equal to 10 log(¼) and is 25% of input light) and the tunable wavelength range is 20 nm (=4×5 nm).

As above, there is a problem of very high optical loss in the optical coupler itself. Also, in order to form an output channel having a different tunable wavelength range, in the beginning of manufacturing an optical module device, an optical coupler having the required number of channels has to be used.

According to an exemplary embodiment of the present invention, an optical module device that has low optical loss and is capable of easily increasing or decreasing channels is provided.

Figure 2:
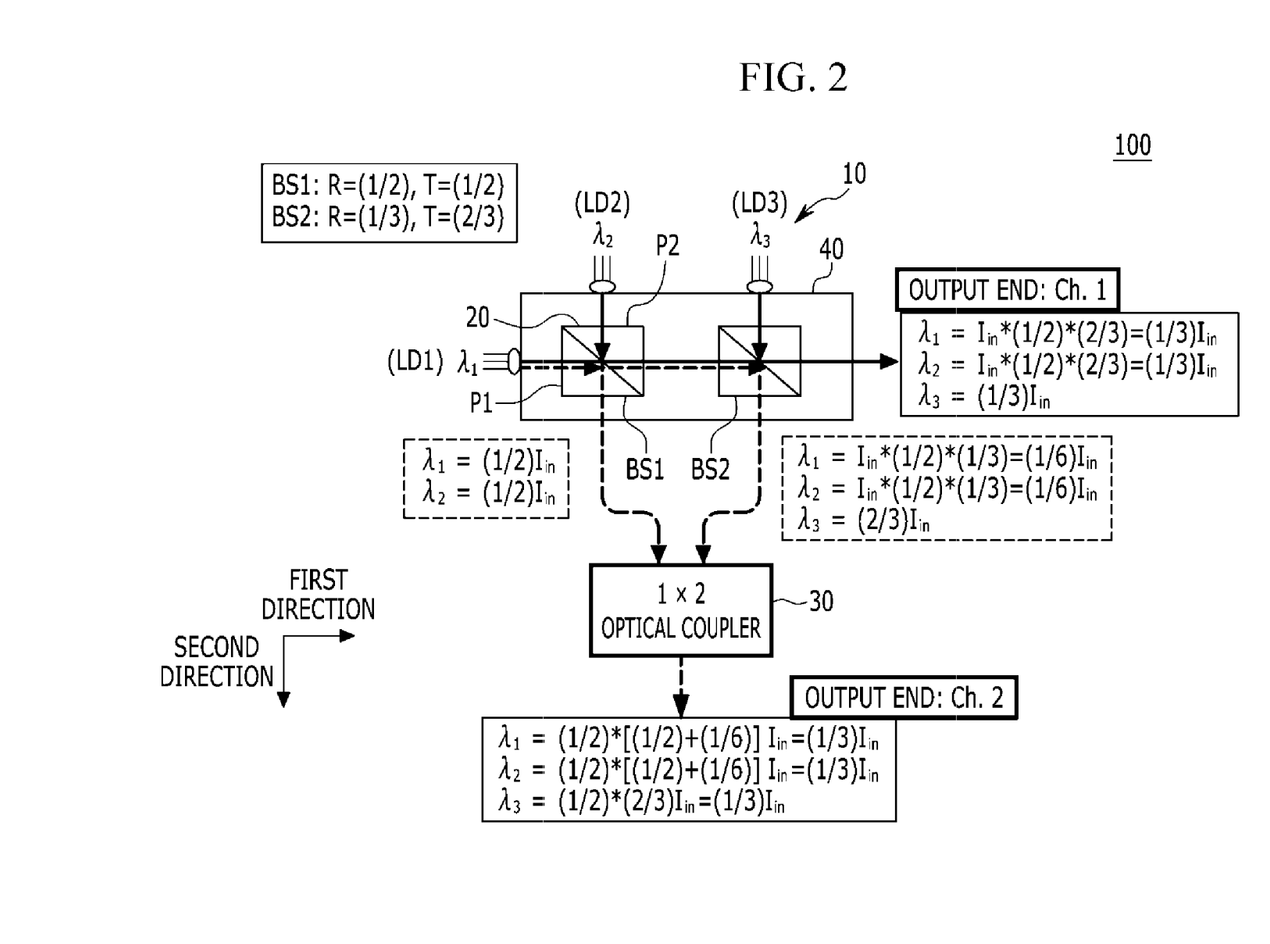
FIG. 2 shows a structure of an optical module device according to a first exemplary embodiment of the present invention.

FIG. 2 shows a structure of an optical module device according to the first exemplary embodiment of the present invention.

As shown in FIG. 2, an optical module device 100 according to the first exemplary embodiment of the present invention includes a light source unit 10, a beam splitter unit 20, and an optical coupler 30 for coupling and outputting light outputted from the beam splitter unit 20.

The light source unit 10 includes a plurality of laser diodes having different center wavelengths. Here, the light source unit 10 includes three laser diodes LD1, LD2, and LD3. The laser diodes LD1, LD2, and LD3 output light having similar optical intensity. Each of the laser diodes LD1, LD2, and LD3 operates according to the current applied from the outside, and the optical intensity outputted from the laser diodes LD1, LD2, and LD3 is similar to each other. When the center wavelength of the laser diodes is $\lambda_1$, $\lambda_2$, and $\lambda_3$, respectively, it is possible to vary the center wavelengths by changing the current inputted to the laser diodes. The wavelength of the light outputted by coupling light from N light sources may vary as much as a total of $\alpha N$, wherein $\alpha$ represents a wavelength modulation range according to current modulation of each laser diode. Meanwhile, the light outputted from the laser diodes is focused or aimed via an optical lens (not shown) and the laser diodes may be fixed to a plate by welding.

The beam splitter unit 20 includes a plurality of beam splitters BS1 and BS2 and the beam splitters are located on a plate 40. The beam splitter according to an exemplary embodiment of the present invention includes a first incident surface P1 and a second incident surface P2. Light applied to each incident surface is reflected by an inner surface which is formed in the interior of the beam splitter or passes through the inner surface. Hereinafter, a reflex action of light is described with the reflection of light by the beam splitter, which substantially represents that light is reflected by the inner surface of the beam splitter. Also, the beam splitter further includes an incident surface besides the first incident surface P1 and the second incident surface P2. Hereinafter, for convenience of explanation, the incident surfaces associated with the laser diode among the plurality of incident surfaces may be referred to as the first incident surface P1 and the second incident surface P2 to describe the operation of the beam splitter.

In the first exemplary embodiment of the present invention, three laser diodes LD1, LD2, and LD3 are used for the total of $3\alpha$ wavelength conversion and the first beam splitter BS1 and the second beam splitter BS2 are used.

The reflectivity and transmissivity of the first beam splitter BS1 has to be different from those of the second beam splitter BS2 so that the output intensity of light according to wavelengths is similar. For example, the reflectivity and transmissivity of the first beam splitter BS1 are ½, respectively, the reflectivity of the second beam splitter BS2 is ⅓, and the transmissivity of the second beam splitter BS2 is ⅔. Here, the reflectivity of the first beam splitter BS1 is ½ and the reflectivity of the second beam splitter BS2 is ⅓. Each beam splitter according to an exemplary embodiment of the present invention has a reflectivity of $1/(k+1)$, wherein the k represents an order of a beam splitter. For example, when the beam splitters are sequentially disposed on the same optical axis and the light is inputted in parallel to the optical axis, each beam splitter has an order from the side (or a direction) to which the light is input. For example, the first beam splitter BS1 is firstly disposed from the side to which the light is inputted so that the k is 1, and then the reflectivity of the first beam splitter BS1 is ½. Also, the second beam splitter BS2 is secondly disposed from the side to which the light is inputted so that the k is 2 and then the reflectivity of the first beam splitter BS1 is ⅓. Accordingly, each beam splitter according to an exemplary embodiment of the present invention has the reflectivity of $1/(k+1)$. The farther away from the side to which the light is inputted the position of the beam splitter is, the lower the reflectivity of the beam splitter is.

The first beam splitter BS1 and the second beam splitter BS2 are sequentially on the same optical axis as shown in FIG. 2. Among the plurality of light sources, the first laser diode LD1 is disposed to output light to a first incident surface of the first beam splitter BS1, the second laser diode LD2 is disposed to output light to a second incident surface of the first beam splitter BS1, and the third laser diode LD3 is disposed to output light to a second incident surface of the second beam splitter BS2. Each of the beam splitters BS1 and BS2 includes a first incident surface and a second incident surface. The light inputted to the first incident surface passes through the beam splitter and then is outputted in a first direction or is reflected by the beam splitter and then is outputted in a second direction. The light inputted to the second incident surface is reflected by the beam splitter and then is outputted in the first direction or passes through the beam splitter and then is outputted in the second direction. Here, the first direction is perpendicular to the second direction.

The optical coupler 30 couples and outputs the light from the first beam splitter BS1 and the second beam splitter BS2. The optical coupler 30 is a 1×2 optical coupler. Particularly, the optical coupler 30 couples and outputs the light that is outputted in the second direction by the first beam splitter BS1 and the second beam splitter BS2. The optical module device 100 having the structure as described above outputs light through the output end corresponding to the first direction, that is, a first channel Ch. 1, and also outputs light through the output end corresponding to the second direction, that is, a second channel Ch. 2.

The operation of the optical module device according to the first exemplary embodiment of the present invention will be described.

In the optical module device 100 having the structure as above, the laser diodes LD1, LD2, and LD3 output the light having a center wavelength $\lambda_1$, $\lambda_2$, and $\lambda_3$, respectively. The light of $\lambda_1$ outputted from the first laser diode LD1 is inputted to the first incident surface P1 of the first beam splitter BS1. After that, the light of $\lambda_1$ sequentially passes through the first beam splitter BS1 and the second beam splitter BS2, and then is outputted in the first direction. Also, the light of $\lambda_1$ is reflected by the first beam splitter BS1 and then is outputted in the second direction. Further, the light of $\lambda_1$ passes through the first beam splitter BS1, is reflected by the second beam splitter BS2, and then is outputted in the second direction. The light of $\lambda_2$ outputted from the second laser diode LD2 is inputted to the second incident surface P2 of the first beam splitter BS1. After that, the light of $\lambda_2$ passes through the first beam splitter BS1 and then is outputted in the second direction. Also, the light of $\lambda_2$ is reflected by the first beam splitter BS1, passes through the second beam splitter BS2, and then is outputted in the first direction. Further, the light of $\lambda_2$ is reflected by the first beam splitter BS1 and the second beam splitter BS2 and then is outputted in the direction corresponding to the second incident surface P2.

The light of $\lambda_3$ outputted from the third laser diode LD3 is inputted to the second incident surface P2 of the second beam splitter BS2. After that, the light of $\lambda_3$ passes through the second beam splitter BS2 and then is outputted in the second direction or is reflected by the second beam splitter BS2 and then is outputted in the first direction.

Accordingly, the light of $\lambda_1$ that passes through both of the first beam splitter BS1 and second beam splitter BS2, the light of $\lambda_2$ that is reflected by the first beam splitter BS1 and then passes through the second beam splitter BS2, and the light of $\lambda_3$ that is reflected by the second beam splitter BS2 are outputted in the first channel Ch. 1 of the output end corresponding to the first direction. The intensity of the light outputted from the first channel Ch.1 is one-third of the intensity of the input light. Thus, the intensity of the light outputted from the first channel Ch.1 is the same as the intensity obtained by using a 1×3 optical coupler. Here, the input light represents the light that is outputted from the laser diodes LD1, LD2, and LD3.

In the first exemplary embodiment of the present invention, the light is also outputted through another output end, that is, the second channel Ch. 2 besides the light outputted from the first channel Ch. 1. Accordingly, the number of output channels is doubled compared to the existing optical module device. Here, through the second channel Ch. 2, the light of $\lambda_1$ that is reflected by the first beam splitter BS1, the light of $\lambda_2$ that passes through the first beam splitter BS1, and the light of $A_3$ that passes through the second beam splitter BS2 are coupled by the 1×2 optical coupler 30 and then outputted. The intensity of the light outputted from the second channel Ch. 2 is one-third of the intensity $I_{in}$ of the input light, like the intensity of the light outputted from the first channel Ch. 1. The wavelength bands of the channels Ch. 1 and Ch. 2 are determined by the wavelengths of the laser diodes LD1-LD3.

According to the first exemplary embodiment of the present invention, by using the plurality of beam splitters having different reflectivity and transmissivity, an optical module device in which the optical power of channels (a laser diode or a wavelength) is similar or the same and the number of channels (an increase or decrease of the number of laser diodes) easily decreases and increases may be provided. In addition, it is possible to increase the number of output channel doubles and to reduce optical loss.

Meanwhile, it is possible to increase the tunable wavelength range of the optical module device.

Figure 3:
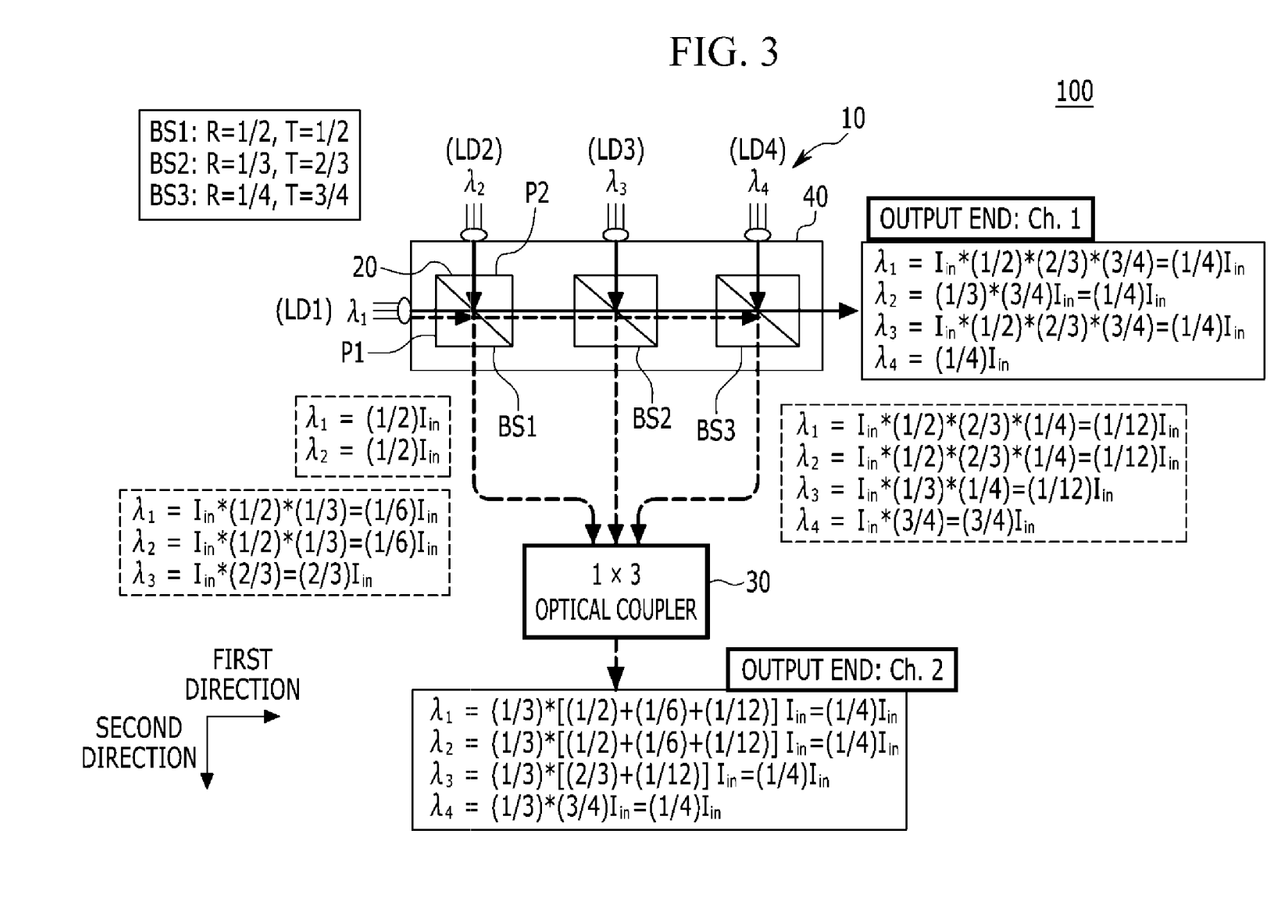
FIG. 3 shows a structure of an optical module device according to a second exemplary embodiment of the present invention.

FIG. 3 shows a structure of an optical module device according to the second exemplary embodiment of the present invention.

The optical module device 100 according to the second exemplary embodiment of the present invention is based on the structure of the optical module device in FIG. 2. The light source unit 10 further includes a laser diode having another center wavelength $\lambda_4$, and the beam splitter unit 20 further includes a beam splitter BS3 besides the beam splitters BS1 and BS2 in order to increase the tunable wavelength range. That is, as shown in FIG. 3, the optical module device 100 according to the second exemplary embodiment of the present invention includes, like the first exemplary embodiment, the light source unit 10, the beam splitter unit 20, and the optical coupler 30. Unlike the first exemplary embodiment, the light source unit 10 includes first to fourth laser diodes LD1, LD2, LD3, and LD4, and the beam splitter unit 20 includes first to third beam splitters BS1, BS2, and BS3. The optical coupler 30 is a 1×3 optical coupler. Here, each beam splitter has reflectivity of 1/(k+1) (k represents the order of beam splitter). For example, as shown in FIG. 3, the reflectivity of the first beam splitter BS1 is ½, the reflectivity of the second beam splitter BS2 is ⅓, and the reflectivity of the third beam splitter BS3 is ¼.

In order to increase the tunable wavelength range, in the optical module device having the structure based on the first exemplary embodiment, one laser diode (having a center wavelength $\lambda_4$) is further added and one beam splitter BS3 is further added.

In the optical module device 100 according to the second exemplary embodiment of the present invention, the light of $\lambda_1$ that passes through all of the first beam splitter BS1, the second beam splitter BS2, and the third beam splitter BS3, the light of $\lambda_2$ that is reflected by the first beam splitter BS1 and then passes through the second beam splitter BS2 and the third beam splitter BS3, the light of $\lambda_3$ that is reflected by the second beam splitter BS2 and passes through the third beam splitter BS3, and the light of $\lambda_4$ that is reflected by the third beam splitter BS3 is outputted through the first channel Ch. 1. The intensity of the light outputted from the first channel Ch. 1 is one-fourth of the intensity $I_{in}$ of the input light. Thus, the intensity of the light outputted from the first channel Ch. 1 has the same intensity obtained by using a 1×4 optical coupler.

Also, through the second channel Ch. 2, the light in which the light of $\lambda_1$ reflected by the first beam splitter BS1, the light of $\lambda_2$ having passed through the first beam splitter BS1, the light of $\lambda_3$ having passed through the second beam splitter BS2, and the light of $\lambda_4$ having passed through the third beam splitter BS3 is coupled by the 1×3 optical coupler 30 and is outputted. The intensity of the light outputted from the second channel Ch. 2 is one-fourth of the intensity $I_{in}$ of the input light as the intensity of the light outputted from the first channel Ch. 1.

Here, the reflectivity of the third beam splitter BS3 is ¼ and the transmissivity of the third beam splitter BS3 is ¾. Thus, the optical power of channels (or a wavelength) is similar or the same and the intensity of the light outputted from the channels is one-fourth of the intensity $I_{in}$ of the input light.

According to the second exemplary embodiment of the present invention, the tunable wavelength range may increase compared with the first exemplary embodiment. Particularly, by simply changing an optical coupler into a 1×3 optical coupler suitable for channel addition with respect to the second channel Ch. 2 and adding a beam splitter for the first channel Ch. 1, it is easy to control the tunable wavelength range of the optical module device.

Figure 4:
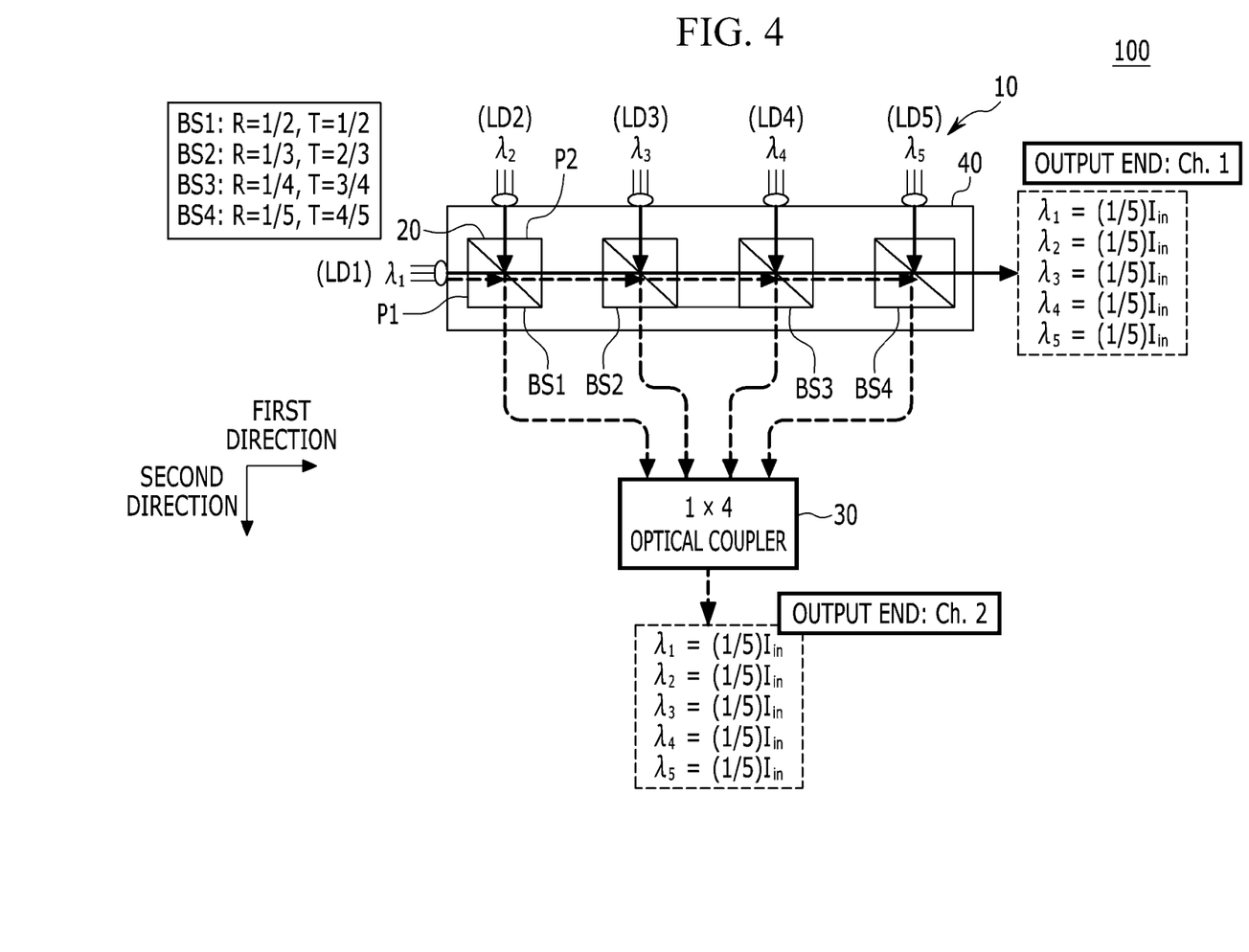
FIG. 4 shows a structure of an optical module device according to a third exemplary embodiment of the present invention.

FIG. 4 shows a structure of an optical module device according to the third exemplary embodiment of the present invention.

The optical module device 100 according to the third exemplary embodiment of the present invention is based on the structure of the optical module device in FIG. 3. The light source unit 10 further includes a laser diode having another center wavelength $\lambda_5$, and the beam splitter unit 20 further includes a beam splitter BS4 besides the beam splitters BS1, BS2, and BS3 in order to increase the tunable wavelength range. That is, as shown in FIG. 4, the optical module device 100 according to the third exemplary embodiment of the present invention includes, like the second exemplary embodiment, the light source unit 10, the beam splitter unit 20, and the optical coupler 30. Unlike the second exemplary embodiment, the light source unit 10 includes first to fifth laser diodes LD1, LD2, LD3, LS4, and LD5, and the beam splitter unit 20 includes first to fourth beam splitters BS1, BS2, BS3, and BS4. Here, each beam splitter has reflectivity of 1/(k+1) (k represents the order of beam splitter). For example, as shown in FIG. 4, the reflectivity of the first beam splitter BS1 is ½, the reflectivity of the second beam splitter BS2 is ⅓, the reflectivity of the third beam splitter BS3 is ¼, and the reflectivity of the fourth beam splitter BS4 is ⅕.

In order to further increase the tunable wavelength range, in the optical module device having the structure based on the second exemplary embodiment, one laser diode (having a center wavelength $\lambda_5$) is further added and one beam splitter BS4 is further added.

In the optical module device 100 according to the third exemplary embodiment of the present invention, the light of $\lambda_1$ that passes through all of the first beam splitter BS1, the second beam splitter BS2, the third beam splitter BS3, and the fourth beam splitter BS4, the light of $\lambda_2$ that is reflected by the first beam splitter BS1 and then passes through the second beam splitter BS2, the third beam splitter BS3, and the fourth beam splitter BS4, the light of $\lambda_3$ that is reflected by the second beam splitter BS2 and passes through the third beam splitter BS3 and the fourth beam splitter BS4, the light of $\lambda_4$ that is reflected by the third beam splitter BS3 and passes through the fourth beam splitter BS4, and the light of $\lambda_5$ that is reflected by the fourth beam splitter BS4 are outputted through the first channel Ch. 1. The intensity of the light outputted from the first channel Ch. 1 is one-fifth of the intensity $I_{in}$ of the input light. Thus, the intensity of the light outputted from the first channel Ch. 1 is the same as the intensity obtained by using a 1×5 optical coupler.

Also, through the second channel Ch. 2, the light in which the light of $\lambda_1$ reflected by the first beam splitter BS1, the light of $\lambda_2$ having passed through the first beam splitter BS1, the light of $\lambda_3$ having passed through the second beam splitter BS2, the light of $\lambda_4$ having passed through the third beam splitter BS3, and the light of $\lambda_5$ having passed through the fourth beam splitter BS4 are coupled by the 1×4 optical coupler 30 and outputted. The intensity of the light outputted from the second channel Ch. 2 is one-fifth of the intensity $I_{in}$ of the input light as the intensity of the light outputted from the first channel Ch. 1.

Here, the reflectivity of the fourth beam splitter BS4 is ⅕ and the transmissivity of the fourth beam splitter BS4 is ⅘. Thus, the optical power of channels (or a wavelength) is similar or the same and the intensity of the light outputted from the channels is one-fifth of the intensity $I_{in}$ of the input light.

According to the third exemplary embodiment of the present invention, the tunable wavelength range may easily increase or decrease.

Meanwhile, unlike the scheme of adding one laser diode and one beam splitter to increase the tunable wavelength range as the above exemplary embodiments, one or more optical module units including some laser diodes and beam splitters are formed, and the multiple of the tunable wavelength range may be obtained by dividing or combining the optical module units. The optical module unit has a simple structure, which has a merit of being easily manufactured.

Figure 5:
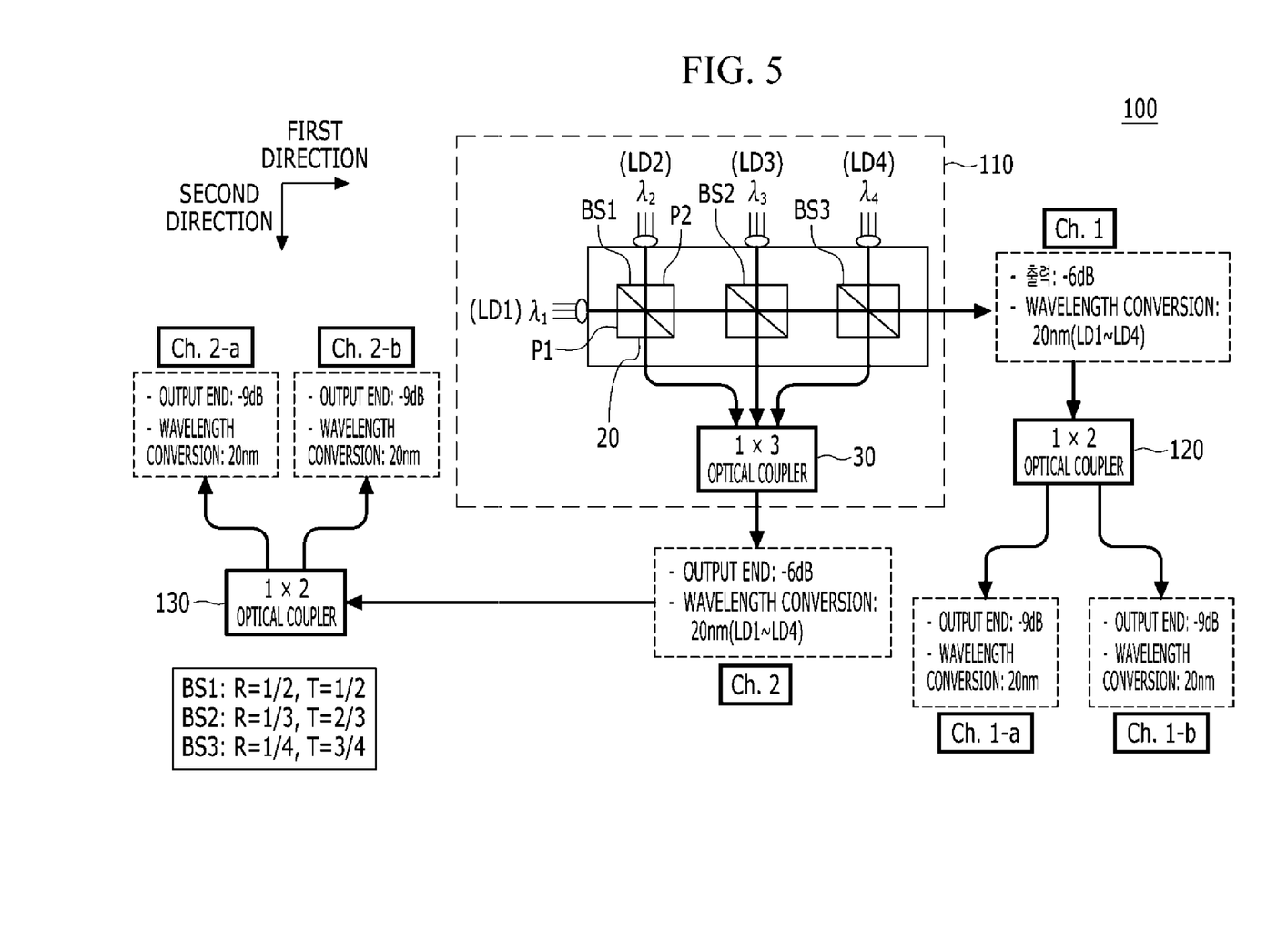
FIG. 5 shows a structure of an optical module device according to a fourth exemplary embodiment of the present invention.

FIG. 5 shows a structure of an optical module device according to the fourth exemplary embodiment of the present invention.

The optical module device 100 according to the fourth exemplary embodiment of the present invention the present invention includes, as shown in FIG. 5, an optical module unit 110 and a plurality of optical dividers 120 and 130.

The optical module unit 110 includes a plurality of laser diodes, a plurality of beam splitters, and an optical coupler. Here, the optical module unit 110, as in the second exemplary embodiment shown in FIG. 3, includes first to fourth laser diodes LD1, LD2, LD3, and LD4, first to third beam splitters BS1, BS2, and BS3, and an optical coupler 30. The detailed structure thereof may be known from the above exemplary embodiments such that its detailed description will be omitted. The optical module unit 110 may not be restricted to the above structure. For example, the optical module unit 110 may have the same structure as the first exemplary embodiment to third exemplary embodiment. Also, based on the exemplary embodiments of the present invention, the optical module unit 110 may be variously configured by changing the number of laser diodes, the number of beam splitters, and the characteristic of the optical coupler.

In the fourth exemplary embodiment of the present invention, two optical dividers are used, and specifically, as shown in FIG. 5, a first optical divider 120 for dividing light outputted through the first channel Ch. 1 and a second optical divider 130 for dividing light outputted through the second channel Ch. 2 are used. Here, the first and second optical dividers 120 and 130 may be 1×2 optical dividers, but are not restricted thereto.

In the optical module device according to the fourth exemplary embodiment of the present invention, as the second exemplary embodiment, the light outputted from the first to fourth laser diodes LD1, LD2, LD3, and LD4 is reflected by the first to third beam splitters BS1, BS2, and BS3 or passes through them, and then is outputted through the first channel Ch. 1 or is coupled through the optical coupler 30 to be outputted through the second channel Ch. 2.

The light outputted through the first channel Ch. 1 is divided by the first optical divider 120 to be outputted through a 1-1 channel Ch. 1-*a* and a 1-2 channel Ch. 1-*b*, respectively. The light outputted through the second channel Ch. 2 is divided by the second optical divider 130 to be outputted through a 2-1 channel Ch. 2-*a* and a 2-2 channel Ch. 2-*b*.

Here, when the wavelength varies by 5 nm by modulating the current inputted to the first to fourth laser diodes LD1, LD2, LD3, and LD4, the total tunable wavelength range is 20 nm (αN=5×4), and the optical power in the first channel Ch. 1 and the second channel Ch. 2 is −6 dB. The two channels Ch. 1 and Ch. 2 are separated by the 1×2 optical dividers 120 and 130, respectively, so that the tunable wavelength range is 20 nm, and the light of −9 dB in which the optical power is reduced by half is outputted through the 1-1 channel Ch. 1-*a*, the 1-2 channel Ch. 1-*b*, the 2-1 channel Ch. 2-*a*, and the 2-2 channel Ch. 2-*b*.

According to the fourth exemplary embodiment of the present invention, it is possible to easily increase the number of output channels while adjusting the tunable wavelength range.

Figure 6:
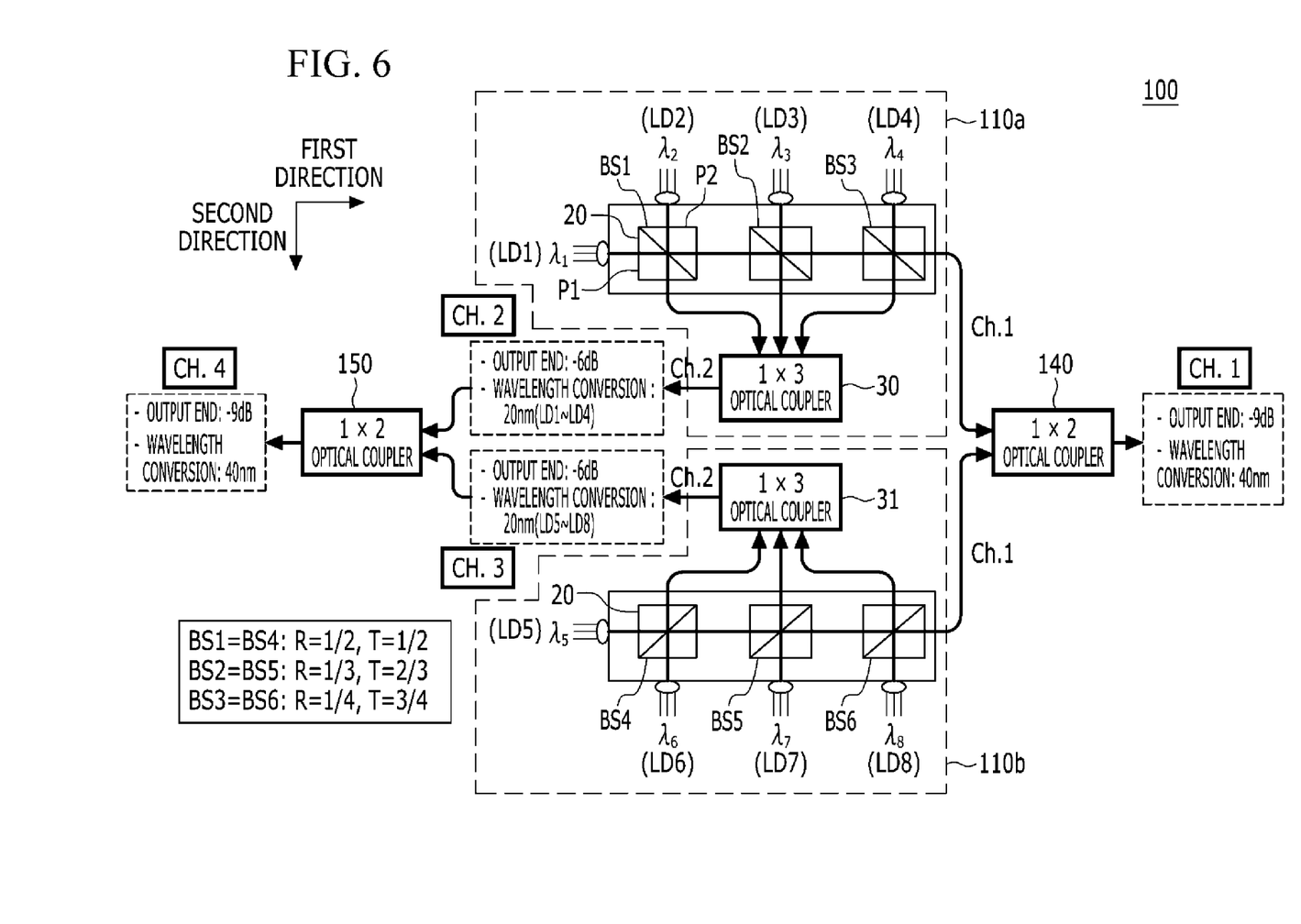
FIG. 6 shows a structure of an optical module device according to a fifth exemplary embodiment of the present invention.

FIG. 6 shows a structure of an optical module device according to the fifth exemplary embodiment of the present invention.

In the fifth exemplary embodiment of the present invention, the output channels having different tunable wavelength ranges may be provided For this purpose, the optical module device 100 according to the fifth exemplary embodiment of the present invention, as shown in FIG. 6, includes two optical module units 110*a* and 110*b*, a first additional optical coupler 140, and a second additional optical coupler 150.

The two optical module units, that is, the first and second optical module units 110a and 110b, as the fourth exemplary embodiment, include first to fourth laser diodes LD1-LD4 and LD5-LD8, first to third beam splitter sets BS1-BS3 and BS4-BS6, and optical couplers 30 and 31, respectively. The detailed structure thereof may be known from the above exemplary embodiments such that its detailed description will be omitted. The first and second optical module units 110a and 110b are not restricted to the above structure.

In the fifth exemplary embodiment of the present invention, the first and second optical module units 110a and 110b are used, and as shown in FIG. 6, the first additional optical coupler 140 and the second additional optical coupler 150 are used. The first additional optical coupler 140 couples the light outputted through the first channel Ch. 1 of the first optical module unit 110a and the light outputted through the first channel Ch. 1 of the second optical module unit 110b and outputs them to a first final output channel CH. 1. The second channel Ch. 2 of the first optical module unit 110a is used as a second final output channel CH. 2, and the second channel Ch. 2 of the second optical module unit 110b is used as a third final output channel CH. 3. Meanwhile, the second additional optical coupler 150 couples the light outputted through the second channel Ch. 2 of the first optical module unit 110a and the light outputted through the second channel Ch. 2 of the second optical module unit 110a and outputs them to a fourth final output channel CH. 4.

In the optical module device according to the fifth exemplary embodiment of the present invention as above, by combining the two optical module units 110a and 110b, the output channels that have different tunable wavelength ranges from each other, for example, an output channel having a tunable wavelength range of 40 nm and an output channel having a tunable wavelength range of 20 nm, may be generated. As shown in FIG. 6, the two optical module units 110a and 110b have the same configuration (i.e., BS1=BS4, BS2=BS5, and BS3=BS6). However, when the tunable wavelength ranges of the optical module units 110a and 110b are in series, for example, when the tunable wavelength range of the first optical module unit 110a is 1510 nm-1530 nm and the tunable wavelength range of the second optical module unit 110b is 1530 nm-1550 nm, the light from the two optical module units 110a and 110b is coupled by the first additional optical coupler 140 so that the first final output channel CH. 1 having a tunable wavelength range of 40 nm may be formed. Also, through the optical module units 110a and 110b, the second final output channel CH. 2 and the third final output channel CH. 3 that have a tunable wavelength range of 20 nm may be formed in each of different wavelength bands. At this time, the wavelength band of the second final output channel CH. 2 is determined by the wavelength of the laser diodes LD1-LD4 of the first optical module unit 110a and the wavelength band of the third final output channel CH. 3 is determined by the wavelength of the laser diodes LD5-LD8 of the second optical module unit 110b. Also, if the second final output channel CH. 2 and the third final output channel CH. 3 are combined by the second additional optical coupler 150, the fourth final output channel CH. 4 that has the same tunable wavelength range and the same optical power may be formed in the wavelength band that is the same as that of the first output channel CH. 1.

Based on the above exemplary embodiments, in addition to the channel configuration, different output channels may be variously formed. Therefore, in the structure of the tunable wavelength optical module device according to the exemplary embodiment of the present invention, the wavelength band, the tunable wavelength range, the optical power, and the number of output channels may be changed by a user according to the environment.

According to an embodiment of the present invention, by sequentially applying current to the light sources having different center wavelengths, the optical module device that can vary the wavelength of the output light by tens of nanometers may be provided.

Also, the optical module device includes beam splitters having different reflectivity and transmissivity so that similar optical power between channels (or between wavelengths) may be formed and the increasing or decreasing of channels is very easy.

In addition, an optical module including a plurality of laser diodes and beam splitters is used as one unit and at least one optical module unit may be combined so that the wavelength band, tunable wavelength range, and optical power of the output channel and the number of output channels may be adjusted according to the environment.

Accordingly, the optical module device according to an exemplary embodiment of the present invention may be used as a light source in a physical quantity measurement system such as an FBG sensor interrogator, and may also be used as an optical transmission module in optical communication.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An optical module device comprising:
   an optical module unit configured to vary wavelengths of light and to output the light through a plurality of channels; and
   at least one optical divider configured to divide the light outputted through each channel of the optical module unit and to output them through a plurality of output channels,
   wherein the optical module unit comprises:
      a light source unit configured to include a plurality of laser diodes that are capable of wavelength modulation according to current, wherein center wavelengths of the laser diodes of the light source unit are different from each other, and N represents the number of laser diodes in the plurality of laser diodes;
      a beam splitter unit configured to include a plurality of beam splitters that have different reflectivity and transmissivity and reflect or transmit light outputted from each laser diode of the light source unit to output them in a first direction or a second direction, the plurality of beam splitters having N−1 beam splitters; and
      an optical coupler configured to couple and output the light from the beam splitter unit,
   wherein the plurality of beam splitters of the beam splitter unit are sequentially disposed on the same optical axis and light is inputted in parallel to the optical axis, the farther away from a side to which the light is inputted a position of a beam splitter is, the lower the reflectivity of the beam splitter is, and wherein for each k in 1 to N−1, the $k^{th}$ beam splitter receives light produced by a $(k+1)^{th}$ laser diode of the plurality of laser diodes.

2. An optical module device comprising:
an optical module unit configured to vary wavelengths of light and to output the light through a plurality of channels; and
at least one optical divider configured to divide the light outputted through each channel of the optical module unit and to output them through a plurality of output channels,
wherein the optical module unit comprises:
   a light source unit configured to include a plurality of laser diodes that are capable of wavelength modulation according to current, wherein center wavelengths of the laser diodes of the light source unit are different from each other, and N represents the number of laser diodes in the plurality of laser diodes;
   a beam splitter unit configured to include a plurality of beam splitters that have different reflectivity and transmissivity and reflect or transmit light outputted from each laser diode of the light source unit to output them in a first direction or a second direction, the plurality of beam splitters having N−1 beam splitters; and
   an optical coupler configured to couple and output the light from the beam splitter unit,
wherein the plurality of beam splitters of the beam splitter unit are sequentially disposed on the same optical axis and light is inputted in parallel to the optical axis, the farther away from a side to which the light is inputted a position of a beam splitter is, the lower the reflectivity of the beam splitter is,
wherein each beam splitter has reflectivity of 1/(k+1), wherein the k represents an order of a beam splitter,
wherein a first beam splitter of the plurality of beam splitters receives light produced by a first laser diode of the plurality of laser diodes, and the first beam splitter has a reflectivity of ½, and
wherein for each k from 2 to N−1, a $k^{th}$ beam splitter of the plurality of beam splitters receives light produced by the first laser diode and transmitted through the $(k−1)^{th}$ beam splitter, and the $k^{th}$ beam splitter has a reflectivity of 1/(k+1).

3. The optical module device of claim 1, wherein the light outputted in the first direction from the beam splitter unit is outputted through a first channel, and the optical coupler couples the light outputted in the second direction from the beam splitter unit to output them through a second channel, wherein the first direction is perpendicular to the second direction.

4. The optical module device of claim 3, wherein the optical divider comprises:
   a first optical splitter configured to divide the light outputted through the first channel to output the light through two channels; and
   a second optical splitter configured to divide the light outputted through the second channel to output the light through two channels.

5. An optical module device comprising:
an optical module unit configured to vary wavelengths of light and to output the light through a plurality of channels; and
at least one optical divider configured to divide the light outputted through each channel of the optical module unit and to output them through a plurality of output channels,
wherein the optical module unit comprises:
   a light source unit configured to include a plurality of laser diodes that are capable of wavelength modulation according to current, wherein center wavelengths of the laser diodes of the light source unit are different from each other, and N represents the number of laser diodes in the plurality of laser diodes;
   a beam splitter unit configured to include a plurality of beam splitters that have different reflectivity and transmissivity and reflect or transmit light outputted from each laser diode of the light source unit to output them in a first direction or a second direction, the plurality of beam splitters having N−1 beam splitters; and
   an optical coupler configured to couple and output the light from the beam splitter unit,
wherein the plurality of beam splitters of the beam splitter unit are sequentially disposed on the same optical axis and light is inputted in parallel to the optical axis, the farther away from a side to which the light is inputted a position of a beam splitter is, the lower the reflectivity of the beam splitter is, and
wherein for each k in 1 to N−1, the $k^{th}$ beam splitter provides first and second outputs, each output of the $k^{th}$ beam splitter including light produced by each of the first through $k+1^{th}$ laser diodes of the plurality of laser diodes.

6. The optical module device of claim 5, wherein the light outputted in the first direction from the beam splitter unit is outputted through a first channel, and the optical coupler couples the light outputted in the second direction from the beam splitter unit to output them through a second channel, wherein the first direction is perpendicular to the second direction.

7. The optical module device of claim 6, wherein the optical divider comprises:
   a first optical splitter configured to divide the light outputted through the first channel to output the light through two channels; and
   a second optical splitter configured to divide the light outputted through the second channel to output the light through two channels.

8. The optical module device of claim 2, wherein the light outputted in the first direction from the beam splitter unit is outputted through a first channel, and the optical coupler couples the light outputted in the second direction from the beam splitter unit to output them through a second channel, wherein the first direction is perpendicular to the second direction.

9. The optical module device of claim 8, wherein the optical divider comprises:
   a first optical splitter configured to divide the light outputted through the first channel to output the light through two channels; and
   a second optical splitter configured to divide the light outputted through the second channel to output the light through two channels.

* * * * *